United States Patent [19]

DiSalvo et al.

[11] Patent Number: 4,557,860
[45] Date of Patent: Dec. 10, 1985

[54] SOLVENTLESS, POLYIMIDE-MODIFIED EPOXY COMPOSITION

[75] Inventors: Anthony L. DiSalvo, Greenwich, Conn.; Ki-Soo Kim, Katonah, N.Y.

[73] Assignee: Stauffer Chemical Company, Westport, Conn.

[21] Appl. No.: 628,541

[22] Filed: Jul. 6, 1984

[51] Int. Cl.[4] .............................................. H01B 1/02
[52] U.S. Cl. .................................... 252/512; 252/513; 252/514; 523/400; 525/423; 525/430
[58] Field of Search ............... 523/400, 412, 413, 414; 525/423, 43 D; 252/514, 512, 513

[56] References Cited

U.S. PATENT DOCUMENTS

| | | | |
|---|---|---|---|
| 3,637,901 | 1/1972 | Bargain et al. | 525/423 |
| 3,663,651 | 5/1972 | Trant | 525/423 |
| 3,763,087 | 10/1973 | Holub et al. | 523/457 |
| 3,856,752 | 12/1974 | Bateman et al. | 524/600 |
| 3,920,768 | 11/1975 | Kwiatkowski | 525/533 |
| 3,998,779 | 12/1976 | Baer | 252/512 |
| 4,118,535 | 10/1978 | Banucci et al. | 525/423 |
| 4,212,959 | 7/1980 | Fukami et al. | 525/930 |
| 4,237,262 | 12/1980 | Jones | 528/322 |
| 4,418,166 | 11/1983 | Chesney et al. | 523/400 |

OTHER PUBLICATIONS

Lee et al.; Handbook of Epoxy Resins; McGraw-Hill Book Co.; 1967; pp. 13-7, 13-8.

*Primary Examiner*—Lewis T. Jacobs
*Attorney, Agent, or Firm*—Richard P. Fennelly

[57] ABSTRACT

Adhesive compositions are disclosed which comprise: (a) an epoxy resin; (b) a soluble polyimide resin; and (c) a monoepoxy diluent. Such compositions are curable by using conventional epoxy curing agent(s). If desired, conductive adhesives of this type can be formed by blending the composition with a conductive filler component.

9 Claims, No Drawings

SOLVENTLESS, POLYIMIDE-MODIFIED EPOXY COMPOSITION

BACKGROUND OF THE INVENTION

1. Field of the Invention

The present invention relates to a polyimide-modified epoxy composition which does not contain unreactive solvent which must be removed during curing. It is useful as an adhesive composition.

2. Description of the Prior Art

A wide variety of adhesives are known based upon polyimide-modified epoxy resins in which solvent is used to insure that the adhesive composition is sufficiently castable or formable prior to curing. During the curing operation this solvent must be removed in order for the adhesive to suitably cure.

SUMMARY OF THE PRESENT INVENTION

The present invention relates to a polyimide-modified epoxy adhesive composition which does not contain an unreactive solvent component. Therefore, the present adhesive is one which can be used without the problems incident to the removal of such extraneous solvent from adhesives known to the prior art (e.g., disposal problems, the presence of undesired voids or spaces in the cured adhesive, etc.). The adhesive of the present invention comprises a polyfunctional epoxy resin component, a soluble polyimide resin, a reactive monoepoxy diluent which allows for dissolution of the polyimide into the epoxy resin, and, optionally, a hardener for the polyepoxy compound. Optionally, the adhesive can also contain a conductive filler when it is used in environments where it need be conductive.

DETAILED DESCRIPTION OF THE INVENTION

The epoxy resin component which forms an important portion of the present adhesive (5% to about 90%, by weight of epoxy resin, polyimide and diluent, preferably 15% to 60%) is a conventional crosslinkable polyfunctional epoxy resin. The epoxy resins useful in this invention are those resins which contain more than one 1,2-epoxy group per molecule. They can be saturated or unsaturated aliphatic, cycloaliphatic or heterocyclic groups and can be monomeric or polymeric in nature. The weight per epoxide of such resins can be within the range of about 100 to about 2,000.

Useful epoxy resins are the glycidyl polyethers of polyhydric phenols which are derived from an epihalohydrin, e.g., epichlorohydrin, and a polyhydric phenol. Examples of such polyhydric phenols include resorcinol, hydroquinone, bis(4-hydroxyphenyl)-2,2-propane (or bisphenol A as it is commonly called), 4,4'-dihydroxybenzophenone, bis(4-hydroxyphenyl)-1,1-ethane, bis(4-hydroxyphenyl)-1,1-isobutane, bis(4-hydroxyphenyl)2,2-butane, bis(2-dihydroxynaphthyl)methane, phloroglucinol, and bis(4-hydroxyphenyl)sulphone. Additional polyhydric phenols are novolac resins containing more than two phenol, or substituted phenol, moieties linked through methylene bridges, as well as halogenated, e.g., brominated and chlorinated, phenolic compounds.

Additional epoxy resins are glycidyl polyethers of polyhydric alcohols prepared by reacting a polyhydric alcohol with an epihalohydrin using an acidic catalyst, e.g., boron trifluoride, and subsequently treating the resulting product with an alkaline dehydrohalogenating agent. Included among the polyhydric alcohols that can be used in the preparation of these polyepoxy materials are glycerine, ethylene glycol, propylene glycol, diethylene glycol, hexanediol, hexanetriol, trimethylol propane, trimethylol ethane, pentaerythritol, and the like.

Other epoxy resins are glycidyl esters of polycarboxylic acids which are derived from an epihalohydrin and a polycarboxylic acid. Examples of polycarboxylic acids include phthalic acid or its anhydride, isophthalic acid, terephthalic acid, tetrahydrophthalic acid, hexahydrophthalic anhydride, adipic acid, dimerized fatty acids, dibasic acids made from an unsaturated fatty acid and acrylic acid, and the like.

The most preferred epoxy resins are glycidyl polyethers of polyhydric phenols, particularly the glycidyl polyether of bisphenol A and epoxylated phenol or cresol novolac resins.

The soluble polyimide component of the present invention is present at from about 0.1% to about 20%, by weight of epoxy, polyimide and diluent, preferably 1% to 10%. The type of polyimide resins described in U.S. Pat. No. 3,856,752 to J. Bateman et al. which are commercially available from Ciba-Geigy Corporation, e.g, under the trademark XU218, are suitable resins which can be utilized. These are fully imidized polyimide resins which are soluble in various solvents. They are derived from phenylindane diamines and dianhydrides as described more fully in the above-referenced U.S. patent which is incorporated herein by reference. The polyimides are prepared by reacting a phenylindane diamine with a dianhydride in an organic reaction medium which is a solvent for at least one of the reactants, preferably under anhydrous conditions under 100° C. The resulting product is a polyamide acid which is then converted to the desired polyimide by one of several methods: heating the polyamide acid solution until imidization is substantially complete; or by combining the polyamide acid solution and a dehydrating agent, with or without catalyst, and optionally heating the resulting mixture until imidization is substantially complete.

In order to assure dissolution of the above-identified polyimide resin into the epoxy resin component, the present invention contemplates the use of from about 5% to about 60%, by weight of epoxy, polyimide and diluent, preferably 10–40%, of a reactive monoepoxy diluent as a reactive material which functions as a solvent prior to curing but which after curing becomes an integral part of the cured adhesive matrix. These reactive monoepoxy diluents contain an epoxide group at one end of the molecule linked to an aryl substituent. Representative examples of reactive epoxy diluents which can be used include styrene oxide, phenyl glycidyl ether, and cresyl glycidyl ether. These compounds exhibit a good solubility characteristic toward the polyimide resin and the epoxy resin.

An optional component of the unfilled adhesive compositions of the present invention is from about 0.5% to about 80%, by weight of the weight of hardener plus adhesive, preferably 2% to 60%, of a conventional hardener for the type of polyepoxy component which is described above. If a person wished to make a curable adhesive which, when combined with the hardener would be curable, they could eliminate the hardener from the composition they sell. This type of hardener acts by crosslinking the epoxy resin and also reacts with the monoepoxy diluent to cure the system. It can be added to the aforementioned curable adhesive by the end user, if desired.

Representative curing agents include aliphatic polyamines having at least three active amine hydrogen atoms per molecule. Examples of such amines are the polyalkylene polyamines, e.g., diethylene triamine, triethylene tetraamine, tetraethylene pentamine and pentaethylene hexamine. Additional useful amines are ethylene diamine, tetramethylene diamine, hexamethylene diamine, xylene diamine, and the like. Adducts of such amines with acrylonitrile, acrylic acid, ethyl acrylate and the like are also useful if the adduct contains at least three active amine hydrogen atoms. Also included as useful amines are amidoamines obtained by reacting polyamines with fatty acids, both monomers and dimers, provided of course that the resulting amidoamine contains at least three active amine hydrogen atoms per molecule.

Additional curing agents which can be used with the compositions of this invention include the amine terminated polyamides, aromatic amines, mercaptans, anhydrides, isocyanates, and catalyst/latent hardeners such as boron trifluoridemonoethylamine and dicyandiamide.

Representative aromatic amines include metaphenylene diamine, 4,4'-methylenediamine, p-aminophenyl sulfone, benzyldimethylamine, and the like. Exemplary anhydride curing agents are NADIC METHYL ANHYDRIDE brand curing agent (methylbicyclo[2.2.1]heptene-2,3-dicarboxylic anhydride isomers), hexahydrophthalic anhydride, phthalic anhydride, pyromellitic dianhydride, maleic anhydride, trimellitic anhydride, benzophenone tetracarboxylic dianhydride, chlorendic anhydride, and dodecenylsuccinic anhydride.

The type of curable resin composition which is formed using these four materials as its constituent elements has utility in various bonding applications where high temperature characteristics are important. For example, metal-to-metal bonding and plastic bonding in high temperature environments are examples of where the adhesive can find utility.

If a conductive adhesive composition having good high temperature properties is desired, e.g., for semiconductor die bonding to chip carriers, the aforementioned curable adhesive composition can be modified by the addition of a sufficient amount of conductive filler to give the desired conductivity characteristics to the final product. If the conductive filler is used, it will generally be a major portion of the resulting adhesive, e.g., from about 50% to 75% by weight of the aforementioned adhesive (including hardener, if desired) and conductive filler component. Other fillers, pigments and dyes may be incorporated. The fillers may be in the form of particles or fibers. Typical fillers include ground ceramics, silica, mica, treated clays, titanium dioxide, graphite, carbon black, glass fibers, and metal powders such as copper, aluminum, silver, and gold.

The present invention is further illustrated by the Examples which follow which give certain preferred embodiments for the adhesive of the present invention.

EXAMPLE 1

Polyimide resin (CIBA-GEIGY XU 218 brand), 0.15 gm, was dissolved in 0.8 gm of phenyl glycidyl ether at 130° C. To this was added 1.9 gm of epoxy resin (SHELL EPON 828 brand), and heating was continued to obtain a homogeneous solution. At about 60° C. the solution was mixed with 0.14 gm of 2-ethyl-4-methyl imidazole epoxy curing agent in 0.4 gm of phenyl glycidyl ether. The composition was cured by heating at 80° C. for 1 hour and then at 150° C. for 3 hours. When cured between two glass slides, it gave strong glass to glass bonding. Thermogravimetric analysis of the cured composition showed a weight loss of 7% at 400° C. in air. For comparison, the composition containing no polyimide showed a 9% weight loss at the same temperature.

EXAMPLE 2

Polyimide resin (CIBA-GEIGY XU 218 brand), 1.0 gm, was dissolved in 5.0 gm of styrene oxide at 120° C. To this was added 12.0 gm of novolac epoxy resin (CIBA-GEIGY ECN 1235 brand), and heating was continued to obtain a homogeneous solution. The solution had a Brookfield viscosity of 10,000 cps at 25° C. At about 60° C., 1.0 gm of the solution was mixed with 0.20 gm of p-aminophenyl sulfone curing agent. The composition was cured by heating at 150° C. for 4 hours. When cured between two glass slides, it gave strong glass to glass bonding. Thermogravimetric analysis of the cured composition showed a weight loss of 5% at 400° C. in air.

EXAMPLE 3

Polyimide resin (CIBA-GEIGY XU 218 brand), 1.0 gm was dissolved in 5.0 gm of phenyl glycidyl ether at 120° C. To this was added 10.0 gm of novolac epoxy resin (CIBA-GEIGY ECN 1235 brand), and heating was continued to obtain a homogeneous solution. The solution had a Brookfield viscosity of 42,000 cps at 25° C. At about 60° C., 1.0 gm of the solution was mixed with 0.20 gm of p-aminophenyl sulfone curing agent. The composition was cured by heating at 150° C. for 4 hours. When cured between two glass slides, it gave yielded strong glass to glass bonding. Thermogravimetric analysis of the cured composition showed a weight loss of 7% at 400° C. in air.

EXAMPLES 4 TO 7

Following the procedure of Example 3, an epoxy resin (SHELL EPON 828 brand) containing various amounts of polyimide (CIBA-GEIGY XU 218 brand) were prepared and cured with a NADIC METHYL ANHYDRIDE brand/ethyl methyl imidazole curing agent combination. When cured at 150° C. for 1.5 hours, all gave strong glass to glass bonding. Variation in the compositions and the results of the thermal analysis of the cured compositions are shown in Table 1 which follows:

TABLE 1

| INGREDIENTS | EXAMPLE NO. | | | |
|---|---|---|---|---|
| | 4* | 5 | 6 | 7 |
| Polyimide resin (CIBA-GEIGY XU 218), g. | 0 | 1 | 2 | 3 |
| Phenyl glycidyl ether, g. | 10 | 10 | 10 | 10 |
| Epoxy resin (SHELL EPON 828 brand), g. | 10 | 10 | 10 | 10 |
| Viscosity, cps at 25° C. | 50 | 650 | 6600 | 25000 |
| Curing agents: | | | | |
| NADIC METHYL ANHYDRIDE brand, g. | 10 | 10 | 10 | 10 |
| 5% EMI** in phenyl glycidyl ether, g. | 0.5 | 0.5 | 0.5 | 0.5 |

TABLE 1-continued

| INGREDIENTS | EXAMPLE NO. | | | |
| --- | --- | --- | --- | --- |
| | 4* | 5 | 6 | 7 |
| Weight loss(%) at 400° C. | 33 | 30 | 26 | 28 |

*not part of the present invention. Present for comparison only.
** 1,2-ethyl-4-methyl imidazole.

The above data illustrate less weight loss for the products of Examples 5–7 as compared to Example 4 with an increase in viscosity.

EXAMPLE 8

Polyimide resin (CIBA-GEIGY XU 218 brand), 1.0 gm, was dissolved in 7.0 gm of phenyl glycidyl ether at 120° C. To this was added 10.0 gm of novolac epoxy resin (CIBA-GEIGY ECN 1235 brand), and heating was continued to obtain a homogeneous solution. This was cooled to 70° C., and mixed with 15.0 g. of NADIC METHYL ANHYDRIDE curing agent and 0.1 gm. of 2-ethyl-4-methyl imidazole in 3.0 g. of phenyl glycidyl ether. The solution had a Brookfield viscosity of about 1400 cps at 25° C. Twenty-five grams of the composition of the solution was then mixed with 50 gm. of silver flake (Handy & Harman SILFLAKE 235 brand) and 2 gm. of phenyl glycidyl ether to give a silver filled epoxy resin. Thermogravimetric analysis of the composition cured at 80° C. for thirty minutes and 150° C. for one hour showed a weight loss of 5% at 400° in air. The composition exhibited strong silicon chip to glass bonding.

EXAMPLE 9

This example shows the shear strength of a die (size: 1.29 cm.×1.29 cm.) bonded to a lead frame using the adhesive described in Example 8. The adhesive thickness was 17.8 micrometers (0.7 mil). The adhesive was first "B-staged" (partially cured) at 67° C. for 20 min. and then more fully cured at 150° C. for 30 min. Die shear strength was tested with a Chatillon force gauge by pushing the die sideways. The force required to dislodge each die was recorded.

TABLE 2

| Lead Frames | Die Shear Strength (kg) |
| --- | --- |
| gold*-plated alloy 42** | 10.0 |
| silver*-plated copper | 14.0 |
| silver*-plated alloy 42** | 14.4 |
| plain copper | 8.6 |
| alloy 42** | 11.3 |

*thickness 15 micrometers.
**alloy 42 is an alloy of 42% nickel with substantially all the remainder comprising iron.

The foregoing Examples are intended to illustrate certain embodiments of the present invention but should not be construed in a limiting sense. The scope of protection sought is set forth in the claims which follow.

What is claimed is:

1. A polyimide-modified epoxy adhesive composition which comprises: (a) an epoxy resin; (b) a soluble polyimide resin; and (c) a reactive monoepoxy diluent to dissolve the soluble polyimide resin into the epoxy resin, the soluble polyimide resin comprising from about 0.01% to about 20% by weight of epoxy, polyimide and diluent.

2. A composition as claimed in claim 1 wherein the epoxy resin comprises from about 5% to about 90%, by weight of the composition.

3. A composition as claimed in claim 1 wherein the reactive monoepoxy diluent comprises from about 5% to about 60% by weight of the composition.

4. A composition as claimed in any of claims 1, 2 or 3 which further comprises a hardener for the epoxy resin.

5. A composition as claimed in any of claims 1, 2 or 3 which further comprises from about 0.5% to about 80%, by weight of a hardener for the epoxy resin, based on the weight of hardener and adhesive.

6. A composition as claimed in any of claims 1, 2 or 3 which further comprises a conductive filler.

7. A composition as claimed in any of claims 1, 2 or 3 which further comprises from about 50% to about 75%, by weight of the entire composition, of conductive filler.

8. A composition as claimed in any of claims 1, 2 or 3 which further comprises a hardener for the epoxy resin and a conductive filler.

9. A composition as claimed in any of claims 1, 2 or 3 which further comprises from about 50% to about 75%, by weight of the entire composition, of conductive filler with the hardener comprising from about 0.5% to about 80% by weight of the weight of hardener and adhesive.

* * * * *